(12) United States Patent  
Yokoyama et al.

(10) Patent No.: US 7,446,639 B2  
(45) Date of Patent: Nov. 4, 2008

(54) MICRO POWER CONVERTER AND METHOD OF MANUFACTURING SAME

(75) Inventors: Takeshi Yokoyama, Matsumoto (JP); Yoshikiyo Usui, Matsumoto (JP)

(73) Assignee: Fuji Electric Device Technology Co., Ltd. (JP)

( * ) Notice: Subject to any disclaimer, the term of this patent is extended or adjusted under 35 U.S.C. 154(b) by 0 days.

(21) Appl. No.: 11/765,864

(22) Filed: Jun. 20, 2007

(65) Prior Publication Data

US 2007/0290782 A1    Dec. 20, 2007

(30) Foreign Application Priority Data

Jun. 20, 2006    (JP)    ............................. 2006-170070

(51) Int. Cl.  
*H01F 5/00* (2006.01)  
*H01F 5/04* (2006.01)  
*H01F 27/06* (2006.01)  
*H01L 21/00* (2006.01)  
*H01L 23/58* (2006.01)

(52) U.S. Cl. .................. 336/200; 336/98; 336/105; 257/724; 438/113; 29/607

(58) Field of Classification Search ................. 336/200, 336/98, 105; 438/106, 113; 29/602.1, 607; 257/659, 723, 724  
See application file for complete search history.

(56) References Cited

U.S. PATENT DOCUMENTS 6,930,584 B2    8/2005    Edo et al.  
2004/0179383 A1*  9/2004    Edo et al. .................... 363/111

FOREIGN PATENT DOCUMENTS

JP    2004-274004 A    9/2004

\* cited by examiner

*Primary Examiner*—Evan Pert  
(74) *Attorney, Agent, or Firm*—Rossi, Kimms & McDowell LLP (57) ABSTRACT

A micro power converter is provided in which magnetic flux passing outside of external electrodes and second connection conductors is decreased to reduce noises, and at the same time, adhesiveness of molding resin is preserved to provide excellent humidity resistance.

6 Claims, 14 Drawing Sheets

MICRO POWER CONVERTER AND METHOD OF MANUFACTURING SAME

CROSS REFERENCE TO RELATED APPLICATION

This application is based on, and claims priority from, Japanese Patent Application No. 2006-170070, filed on Jun. 20, 2006, the contents of which are incorporated herein by reference.

BACKGROUND

The present invention relates to a micro power converter that includes a coil substrate, a power supply IC chip and other parts mounted on a substrate; and further to a method of manufacturing the micro power converter.

Figure 17A:
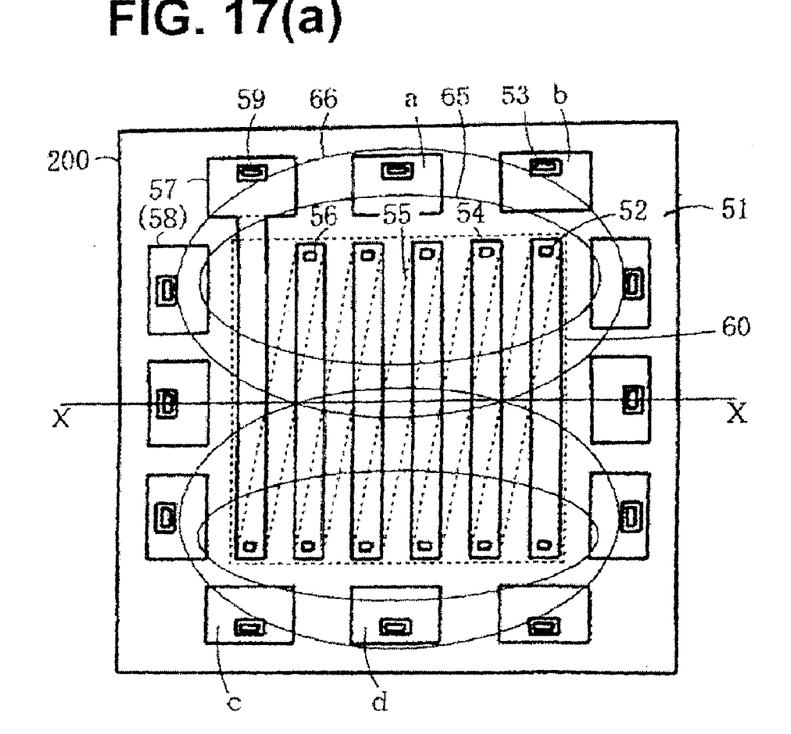
FIG. 17(a) is a plan view of an essential part and FIG. 17(b) is a sectional view taken along the line X-X in FIG. 17(a)
Figure 17B:
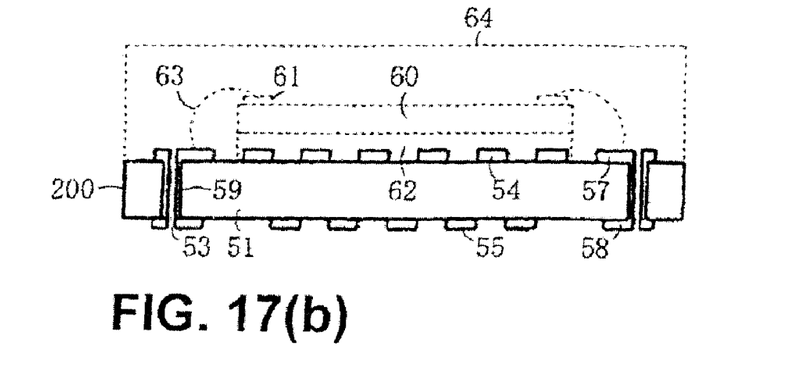

Conventional micro power converters such as DC-DC converters used in micro power supplies have a structure in which a power supply IC chip is mounted on a coil substrate by flip chip bonding or the use of an adhesive, and then is wired with gold wires (bonding wires) followed by sealing with a molding resin. FIGS. 17(a) and 17(b), for example, show a structure of a conventional micro power converter employing adhesive bonding. FIG. 17(a) is a plan view of an essential part and FIG. 17(b) is a sectional view of the essential part taken along the line X-X in FIG. 17(a). In FIG. 17(a), magnetic flux 65, 66 is shown, too.

The coil substrate 200 includes first and second coil conductors 54 and 55, first and second external electrodes 57 and 58, and first and second connection conductors 56 and 59 formed thereon. The coil substrate 200 is Cu-plated for forming first and second connection conductors 56 and 59 on the side faces of first and second through-holes 52 and 53, and forming first and second coil conductors 54 and 55, and first and second external electrodes 57 and 58 on the front and back surfaces of the ferrite substrate 51. The through holes 52 and 53 are bored in advance by a sandblasting technique in the ferrite substrate 51 and are surrounded by the ferrite substrate 51. The first through-holes 52 are formed in the inner region of the ferrite substrate 51. The second through-holes 53 are formed in the peripheral region of the ferrite substrate 51 and surrounded by the ferrite substrate 51. The first and the second external electrodes are formed around the second through-holes 53 and surrounded by the ferrite substrate 51. In the FIGS. 17(a) and 17(b), the reference numeral 60 designates a power supply IC chip, the numeral 61 denotes a pad electrode, the numeral 62 denotes an adhesive, the numeral 63 is a bonding wire, and the numeral 64 is a molding resin.

Japanese Unexamined Patent Application Publication No. 2004-274004 and corresponding U.S. Pat. No. 6,930,584 disclose a micro power converter having a power supply IC chip bonded on a coil substrate by flip chip bonding, in which the length of the coil conductors composing a planar solenoid coil is made longer than a certain value with respect to the width of the magnetic insulator substrate (ferrite substrate) to increase the inductance.

In the structure shown in FIGS. 17(a) and 17(b), the magnetic flux 66 passes through a part of the ferrite substrate 51 located outside the second connection conductor 59 formed at the second through-hole 53, and first and second external electrodes 57, 58, as shown in FIG. 17(a). (Magnetic flux 65 passes through a part located inside of these conductors and electrodes.) As a result, an induced electromotive force (noises) in synchronism with the oscillation frequency is generated between top and bottom of the second connection conductor 59, causing malfunction of the micro power supply.

Figure 18A:
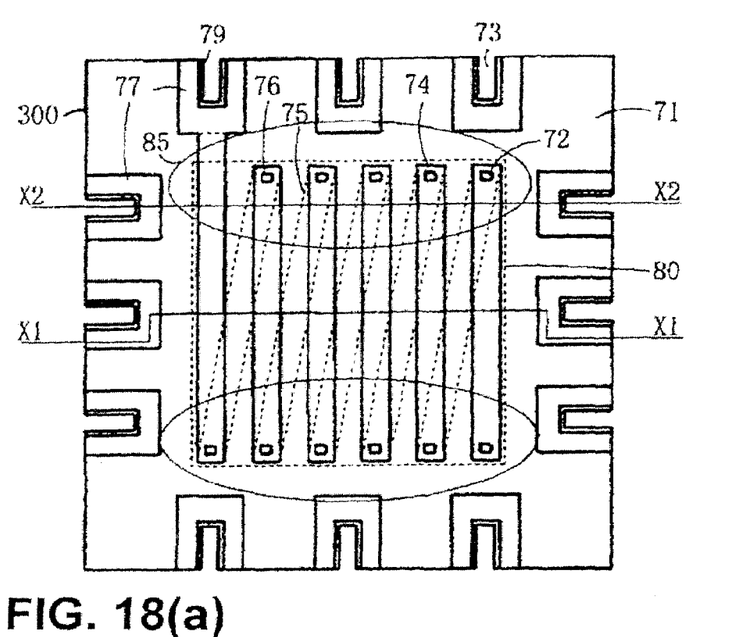
FIG. 18(a) is a plan view of an essential part.
Figure 18B:
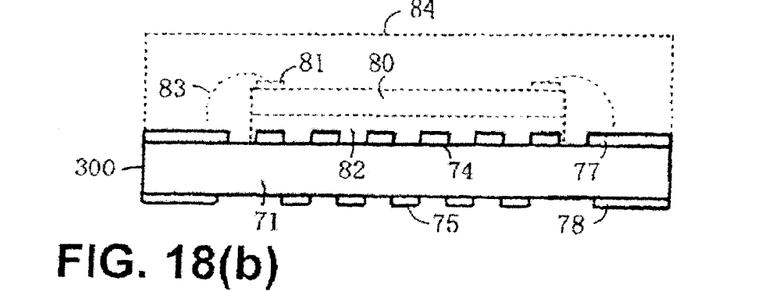
FIG. 18(b) is a sectional view taken along the line X1-X1 in FIG. 18(a)
Figure 18C:
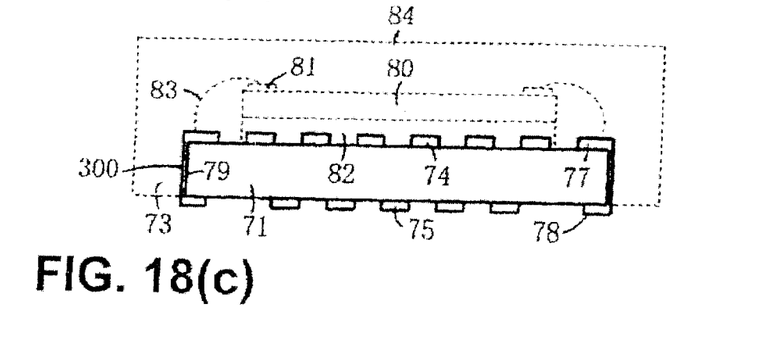
FIG. 18(c) is a sectional view taken along the line X2-X2 in FIG. 18(a).

The above-described malfunctioning can be avoided by the coil substrate 300 shown in FIGS. 18(a), 18(b), and 18(c), in which second through-holes 73 (oblong through-holes) with a slit configuration are provided traversing the side face of the ferrite substrate 71 and passing through the ferrite substrate 71. First and second external electrodes 77, 78, and second connection conductors 79 formed at the second through holes 73 interrupts the magnetic flux that would otherwise pass outside these electrodes and conductors, and the magnetic flux 85 takes a route inside the electrodes and conductors. Therefore, the induced electromotive force generated in the second connection conductors 79 decreases and the noises are reduced. FIG. 18(a) is a plan view of an essential part, FIG. 18(b) is a sectional view of the essential part taken along the line X1-X1 in FIG. 18(a), and FIG. 18(c) is a sectional view of the essential part taken along the line X2-X2 in FIG. 18(a). The reference numeral 80 designates a power supply IC chip, numeral 81, a pad electrode, numeral 82, an adhesive, and numeral 83, a bonding wire. The reference numeral 72 designates a through-hole, 74 and 75 designate first and second coil conductors, while reference numeral 76 designates a first connection conductor.

However, on the surface of the ferrite substrate 71 on which the power supply IC chip 80 is bonded in the structure of FIGS. 18(a), 18(b) and 18(c), the first external electrodes 77 with gold plating are formed up to outermost edge of the ferrite substrate 71. Molding resin 84 is put on the first external electrode 77 in the process of sealing with the molding resin 84. Since the joining interface between the molding resin 84 and the first external electrode 77 has very poor adhesiveness and the interface exposes to outer atmosphere, moisture permeates from the interface between the first external electrode 77 and the molding resin 84 at the outer edge of the ferrite substrate 71. The device also has an external electrode extending up to the edge of the ferrite substrate like FIGS. 18(a) through 18(c). Thus, humidity resistance of the device is degraded.

In view of the above, it would be desirable to solve the above problem and provide a micro power converter in which magnetic flux passing along a route outside of external electrodes and second connection conductors is decreased to reduce noises, and at the same time, adhesiveness of molding resin is preserved to provide excellent humidity resistance. It would further be desirable to provide a method of manufacturing such a micro power converter.

SUMMARY OF THE INVENTION

A micro power converter according to the invention comprises a coil substrate including a coil and external electrodes, a power supply IC chip bonded on a front surface side of the coil substrate, and a resin covering the front surface side of the coil substrate and a front surface side of the power supply IC chip. The coil substrate has a magnetic insulator substrate, coil conductors formed in inner regions on front and back surfaces of the magnetic insulator substrate, and the external electrodes formed in peripheral regions on the front and back surfaces of the magnetic insulator substrate, the coil conductors formed in the inner regions on the front and back surfaces of the magnetic insulator substrate being connected by first connection conductors to form the coil and the external electrodes formed on the front and back surfaces of the magnetic insulator substrate being connected by second connection conductors, and the second connection conductor being surrounded by the magnetic insulator substrate in the front surface side of the magnetic insulator substrate and a side face of the second connection conductor not being surrounded by the magnetic insulator substrate in the back surface side of the magnetic insulator substrate.

The magnetic insulator substrate is preferably a ferrite substrate. Preferably, the front surface side of the coil substrate and a back surface side of the power supply IC chip are bonded with an insulator adhesive, and pad electrodes formed on a front surface of the power supply IC chip and the external electrodes formed on the front surface side of the coil substrate are electrically connected by bonding wires. Preferably, the external electrodes formed on the front surface side of the coil substrate and pad electrodes formed on a back surface side of the power supply IC chip are bonded by stud bumps.

A method according to the present invention is a method of manufacturing a micro power converter that comprises a magnetic insulator substrate, a power supply IC chip bonded on a front surface side of the magnetic insulator substrate, and a resin covering the front surface side of the magnetic insulator substrate and a front surface side of the power supply IC chip, and the method includes:

(i) (a) forming a plurality of first holes from a front surface side towards an interior of the magnetic insulator substrate, and (b) forming plural pairs of second holes surrounding the first holes and in either side of a straight line that becomes a scribe line, the pair of second holes consisting of two second holes disposed at line symmetric positions with respect to the straight line;

(ii) (a) forming third holes each connecting to each of the first holes from a back surface side of the magnetic insulator substrate at positions projecting the first holes towards interior of the magnetic insulator substrate, and (b) forming fourth holes with a oblong shape each connecting to each of the pairs of the second holes at a place including the positions projecting the pair of the second holes surrounding the third holes from the back surface side towards interior of the magnetic insulator substrate;

(iii) (a) forming coil conductors on front and back surfaces of the magnetic insulator substrate connecting different first holes and different second holes, (b) forming first connection conductors on side walls of the first holes and the third holes connecting the coil conductors formed on the front and back surfaces, (c) forming plural pairs of front side external electrodes on the front surface side of the magnetic insulator substrate, each pair disposed at a place including the second holes, surrounded by the magnetic insulator substrate, off the scribe line and along the scribe line, and positioned in line symmetry with respect to the scribe line, (d) forming back side external electrodes on the back surface side of the magnetic insulator substrate at places including at least a part of the positions projecting the pairs of second holes, and (e) forming second connection conductors on side walls of the second holes and the fourth holes, each second connection conductor connecting the front side external conductor and the back side external conductor;

(iv) connecting the power supply IC chip to the front surface side of the magnetic insulator substrate;

(v) covering the front surface side of the magnetic insulator substrate and front surface side of the power supply IC chip with the resin; and (vi) cutting the magnetic insulator substrate and the resin along the scribe line positioned between two external electrodes composing a pair on the front side of magnetic insulator substrate.

Preferably, the external electrode is manufactured by forming a seed layer and then forming a thick copper film on the seed layer. The seed layer is formed of a titanium film (about 0.1 μm) and a copper film (about 1 μm) on the titanium film by means of evaporation or sputtering. Alternatively, the seed layer can be formed by a copper film (about 1 μm) alone by means of electroless plating. The thick copper film is thicker than the copper film of the seed layer and has a thickness in the range of 35 to 65 μm. The thick copper film can be formed by means of electroplating. To obviate corrosion, the thick copper film can be covered by a nickel film (about 2 μm) formed on the thick copper film and a gold film (about 1 μm) formed on the nickel film.

According to the invention, second holes and fourth holes (oblong holes) are formed. Each of the second holes is surrounded by the ferrite substrate and formed on the front surface side of the ferrite substrate that is sealed by the molding resin. The fourth holes are formed on the back surface side of the ferrite substrate. The side face of each fourth hole exposes to the atmosphere. Each of the fourth holes reaches a second hole and combined with the second hole together to form a second through-hole. A first external electrode is formed around the second hole and surrounded by the ferrite substrate. A second external electrode is formed around the fourth hole. A second connection conductor making electrical connection between the first and the second external electrodes is formed on the side wall of the second through-hole. By virtue of this construction, a magnetic flux passing the region outside of the first and second external electrodes and the second connection conductors is significantly decreased to reduce noises. Furthermore, the outer edge of the surface that is sealed by the molding resin is the ferrite substrate. Thus, adhesiveness is preserved to provide a micro power converter exhibiting excellent humidity resistance.

BRIEF DESCRIPTION OF THE DRAWINGS

The invention will be described in greater detail with reference to certain preferred embodiments thereof and the accompanying drawings, wherein:

FIGS. 1(*a*) and 1(*b*) show a construction of a micro power converter that is a first embodiment according to the invention, wherein FIG. 1(*a*) is a plan view of the essential part of the front surface side, and FIG. 1(*b*) is a sectional view of the essential part taken along the line X-X in FIG. 1(*a*);

FIGS. 2(*a*) and 2(*b*) show a construction of a micro power converter that is a first embodiment according to the invention, wherein FIG. 2(*a*) is a plan view of the essential part of the back surface side, and FIG. 2(*b*) is a sectional view of the essential part taken along the line A-A in FIG. 2(*a*);

FIGS. 7(*a*) - (*c*) show an essential step of a manufacturing process that is a second embodiment of the invention, for manufacturing a micro power converter;

FIGS. 8(*a*) and 8(*b*) show an essential step following the step of FIG. 7, of a manufacturing process that is a second embodiment of the invention, for manufacturing a micro power converter;

FIGS. 17(a) and 17(b) show a construction of a micro power converter of a prior art, wherein FIGS. 18(a) - 18(c) show a construction of another micro power converter of a prior art, wherein

DETAILED DESCRIPTION OF THE PREFERRED EMBODIMENTS

Figure 1A:
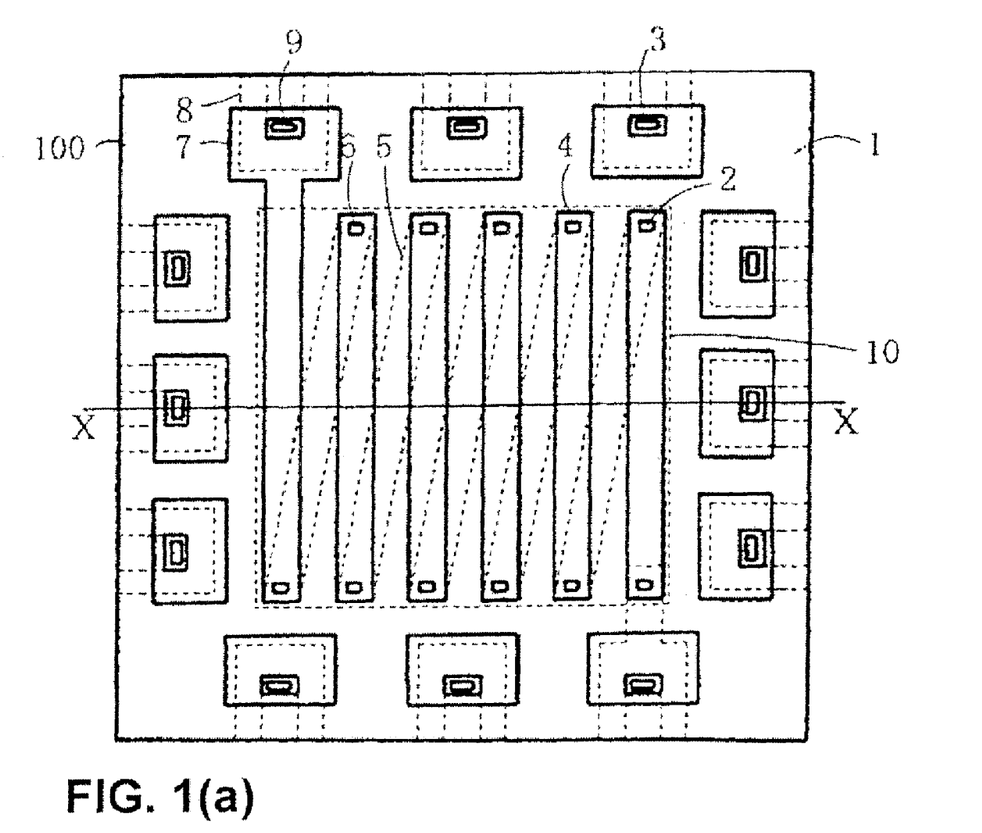
Figure 1B:
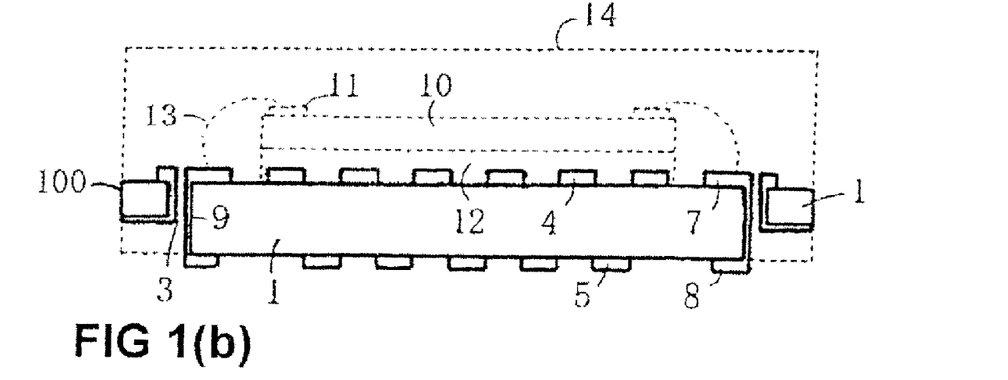
Figures 2A, 2B:
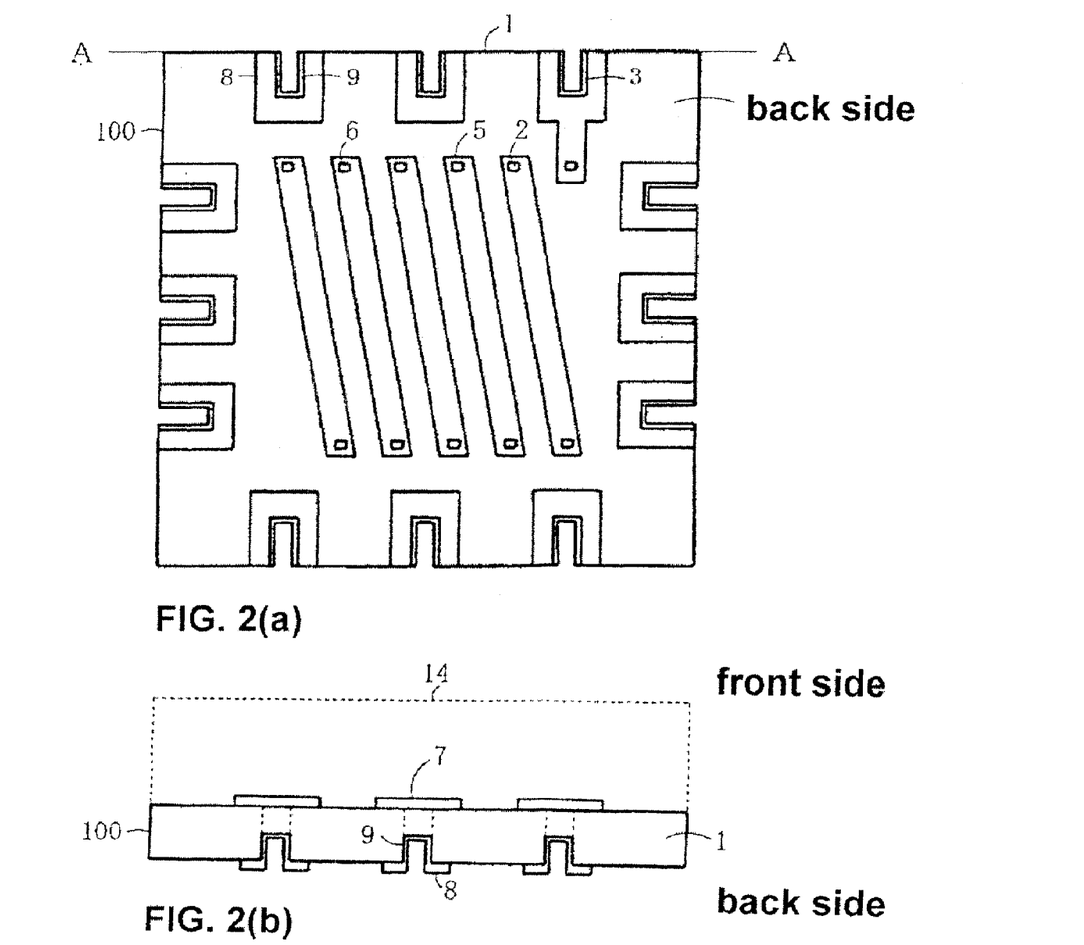

FIGS. 1(a) and 1(b) and FIGS. 2(a) and 2(b) show a construction of a micro power converter that is a first embodiment according to the invention. FIG. 1(a) is a plan view of the essential part of the front side, and FIG. 1(b) is a sectional view of the essential part taken along the line X-X in FIG. 1(a). FIG. 2(a) is a plan view of the essential part of the back side, and FIG. 2(b) is a sectional view of the essential part taken along the line A-A in FIG. 2(a). FIGS. 1(a) and 1(b) and FIGS. 2(a) and 2(b) show a schematic construction of a coil substrate 100 that constitutes a micro power converter. In the sectional views FIG. 1(b) and FIG. 2(b), of essential part, the top of the drawing corresponds to the front surface side of the coil substrate and the bottom corresponds to the back surface side. The coil substrate 100 comprises a ferrite substrate 1, first and second coil conductors 4, 5, first connection conductors 6, first and second external electrodes 7, 8, and second connection conductors 9. The dotted lines in the drawings designate a power supply IC chip 10 and a molding resin 14.

A coil with a solenoid configuration is formed in the inner region of the ferrite substrate 1. A plurality of external electrodes is formed in the peripheral region of the ferrite substrate 1 surrounding the coil. The coil is composed of first coil conductors 4 on the front side (also referred to as front surface side) of the ferrite substrate 1, second coil conductors 5 on the back side (also referred to as back surface side) of the ferrite substrate 1, and first connection conductors 6 each formed on the side wall of first through-hole 2 and connecting the coil conductors 4 and 5. The external electrodes consists of first external electrodes 7 and second external electrodes 8 formed in the peripheral region of the ferrite substrate 1 and surrounding the coil, in which the first external electrodes 7 are formed on the front side of the ferrite substrate 1 and the second external electrodes 8 are formed on the back side of the ferrite substrate 1. The first and second external electrodes 7 and 8 are connected by the second connection conductors 9 formed on the side walls of the second through holes 3. The ferrite substrate 1 used in this example has a specific permeability of about 100.

The first connection conductors 6 are surrounded by the ferrite substrate 1 as shown in FIG. 1(a) and FIG. 2(a). On the other hand, each of the second connection conductors 9 is surrounded by the ferrite substrate 1 in the front side of the ferrite substrate 1, while in the back side, each of the second connection conductors is not surrounded by the ferrite substrate at the side face of the ferrite substrate 1 as shown in FIGS. 2(a), 2(b), and FIG. 1(b). About an upper half of the second connection conductor 9 in the thickness direction of the ferrite substrate 1 is formed within the ferrite substrate 1 while the lower half is not surrounded by ferrite substrate at the side face of the ferrite substrate 1 as shown in FIG. 1(b) and FIG. 2(b). The ferrite substrate has a specific permeability of 100; the second connection conductors 9 at the side faces are formed of copper that has a specific permeability of 1; and the side face of the second connection conductors 9 is not surrounded by ferrite, because resin is included against sides of the second connection conductors at the back sides of the second connection conductors at the back side of the substrate. Since the magnetic flux passes through the ferrite substrate 1, which has a high specific permeability and thus exhibits low magnetic resistance, magnetic flux that passes outside the first external electrodes 7 and the second connection conductors 9 disappears in the lower half position of the ferrite substrate 1. For the magnetic flux that passes through the outer region of the first external electrodes 7 and the second connection conductors 9 in the upper half position of the ferrite substrate 1, the magnetic resistance increases because the thickness of the ferrite substrate 1 drops to half. Thus, the magnetic flux passing this region decreases as compared with the case of conventional coil substrate 200 in FIG. 17. Therefore, noises are reduced in the invented construction.

As shown in FIG. 1(b), the back surface of the power supply IC chip 10 is bonded by an adhesive to the area of the front surface of the coil substrate 100 where the first coil conductors 4 are formed. Pad electrodes 11 on the front surface of the IC chip is connected to the first external electrodes 7 by bonding wires 13. A molding resin 14 covers these parts.

As described above, the first external electrodes 7 are formed within the region of ferrite substrate 1, and the front surface of the ferrite substrate 1 and the molding resin 14 are directly bonded in the whole peripheral region of the ferrite substrate. Therefore, adhesiveness of the molding resin 14 is not impaired in the peripheral region of the ferrite substrate 1 and degradation of humidity resistance is avoided.

Figure 3:
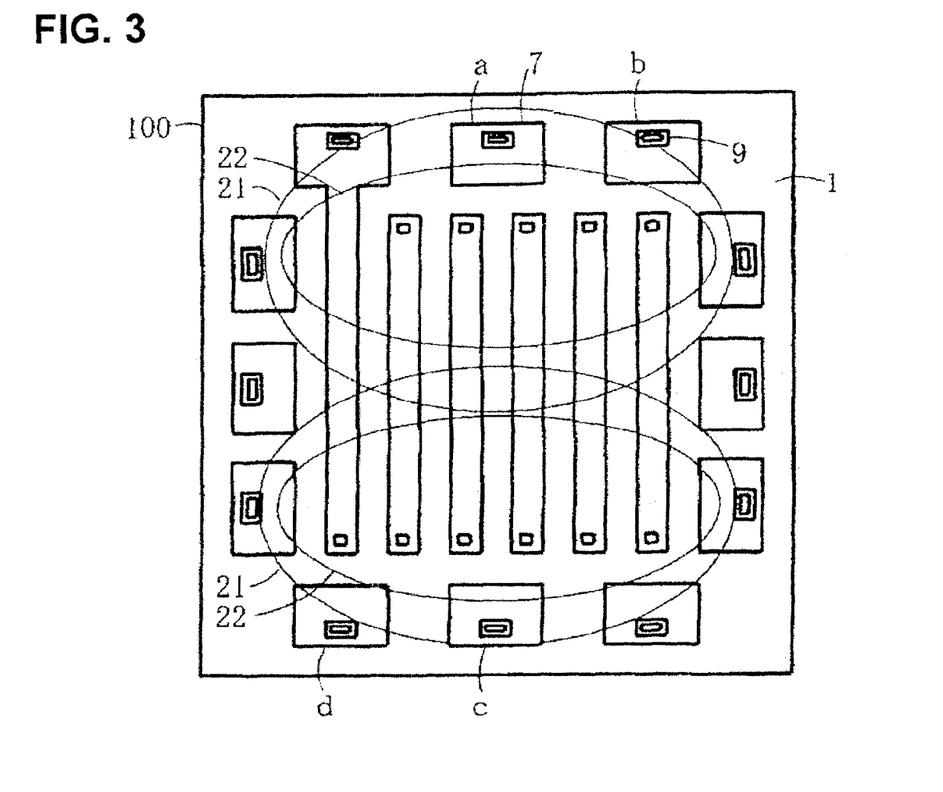
FIG. 3 is a plan view showing magnetic flux on the front surface side of the coil substrate.
Figure 4:
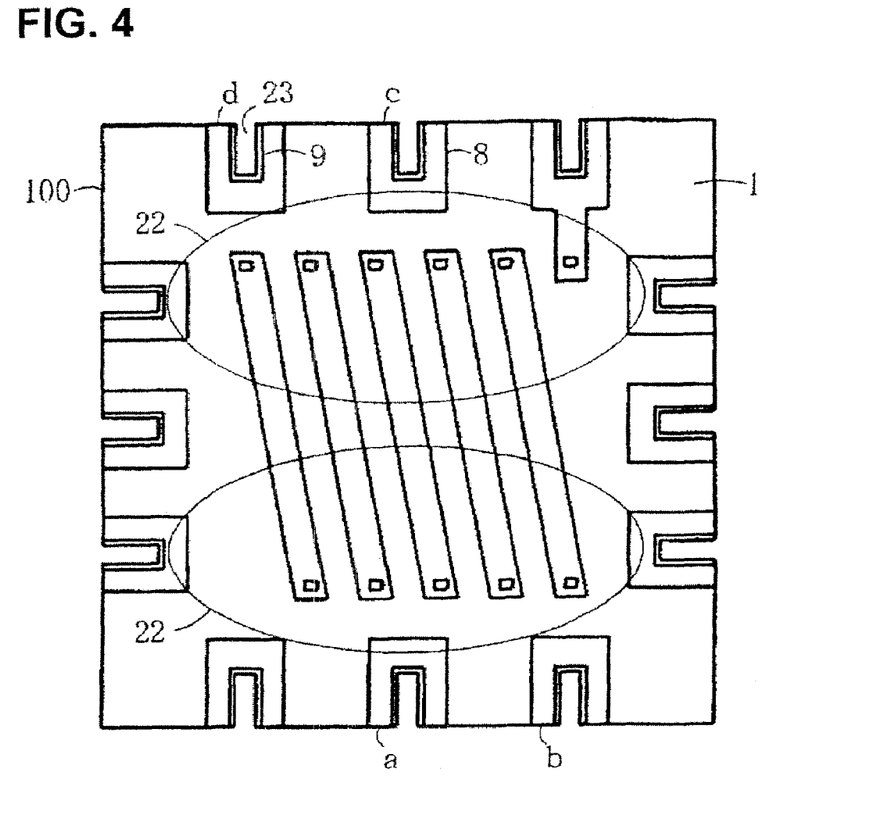
FIG. 4 is a plan view showing magnetic flux on the back surface side of the coil substrate.

FIG. 3 and FIG. 4 are plan views showing magnetic flux in the coil substrate, wherein FIG. 3 shows magnetic flux in the front side and FIG. 4 shows magnetic flux in the back side of the coil substrate. As shown in FIG. 3, there exist magnetic flux 21 passing outside the first external electrodes 7 and magnetic flux 22 passing through the inside in the upper half of the ferrite substrate 1. On the other hand, in the lower half of the ferrite substrate 1 as shown in FIG. 4, the magnetic flux 21 is interrupted by the second connection conductors 9 and the slits 23 in the region of outside the second external electrodes 8. The magnetic flux 21 disappears leaving only the magnetic flux 22 that passes through the region inside the second external electrodes. As a result, the magnetic flux 21 passing through the region outside the first external electrodes 7 decreases to about half of the magnetic flux 66 passing through the region outside the first external electrodes 57 in the conventional coil substrate 200. Consequently, the induced voltage (noises) generated between the first external electrode 7 and the second external electrode 8 (between the both terminals of the second connection conductor 9) decreases.

Figure 5:
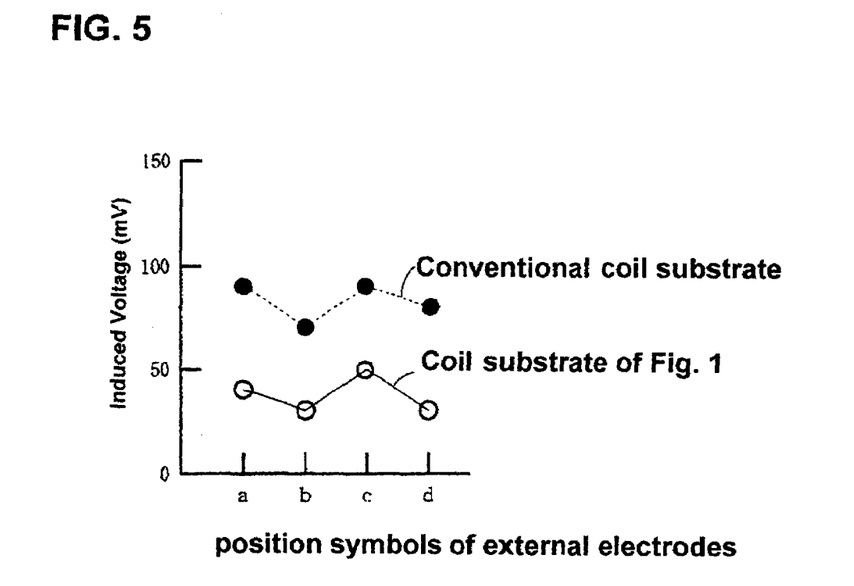
FIG. 5 shows induced electromotive force (induced voltage) produced between first and second external electrodes of the coil substrate.

FIG. 5 shows induced electromotive force (induced voltage) produced between first and second external electrodes of the coil substrate of FIG. 1. The symbols a, b, c, and d (position symbols) define positions of the first and second external electrodes 7 (See FIG. 4). This graph shows induced voltages between the first external electrode 7 on the front surface and the second external electrode 8 on the back surface measured by switching at the current of 50 mA and the frequency of 2.5 MHz. The horizontal axis indicates the position symbols and the vertical axis indicates induced voltage. A case for a conventional coil substrate 200 is also shown for comparison. The induced voltage has been decreased to a half for the coil substrate 100 as compared with the case for the conventional coil substrate 200. Thus, noises have been reduced to a half.

Figure 6:
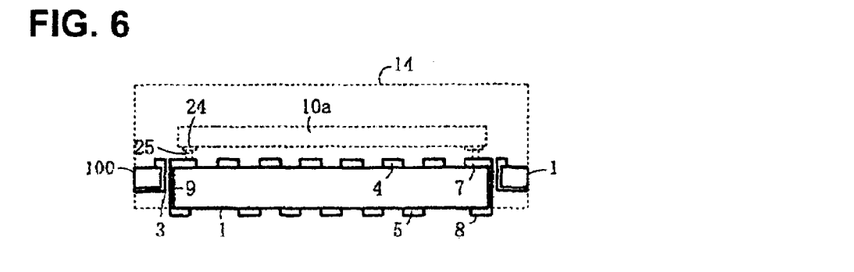
FIG. 6 is a sectional view of an essential part in which the first external electrode 7 is connected by a stud bump 25 formed on a pad electrode 24 of the power supply IC chip 10*a*.
Figure 7A:
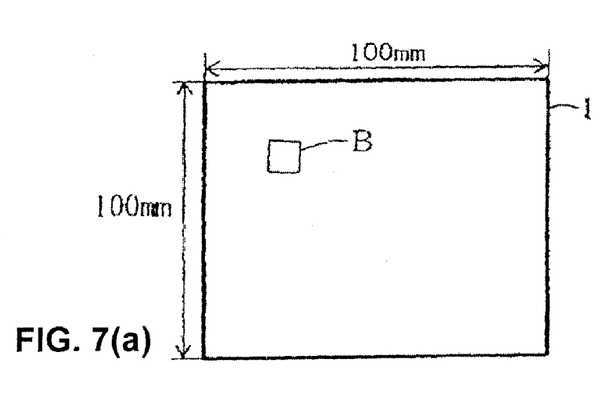
Figure 7B:
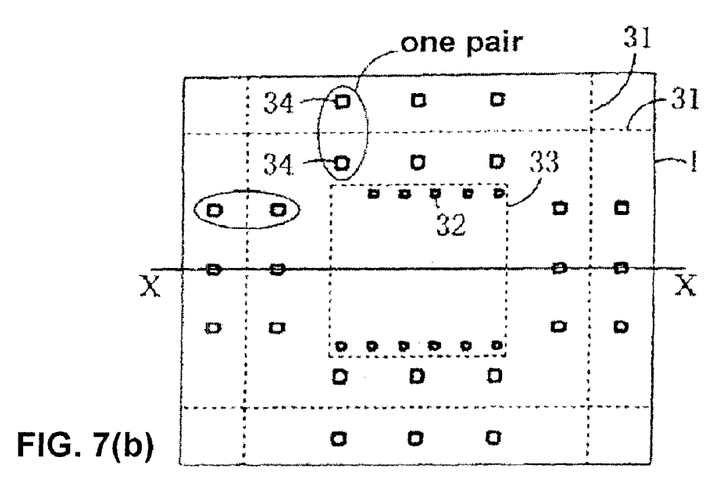
Figure 7C:
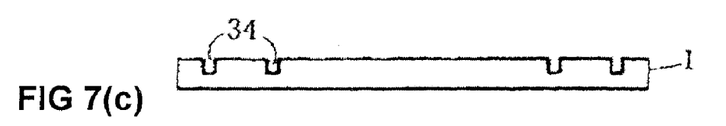

While FIG. 1 shows a construction in which the first external electrodes 7 and the pad electrodes 11 of the power supply IC chip 10 are connected by the bonding wires 13, the present invention can be applied to a construction as shown in FIG. 6 as well in which the first the power supply IC chip 10a is connected by stud bumps 25 formed on the pad electrodes 24 of the chip to the first external electrodes 7. In this case, however, the size of the power supply IC chip 10a must be limited by the size of the ferrite substrate 1 and freedom in the size of the power supply IC chip 10a is lost. Since the power supply IC chip 10a is unnecessarily enlarged, a manufacturing cost may rise.

While the second external electrodes 8 on the back surface side in this embodiment example are formed up to the peripheral edge of the ferrite substrate 1, these electrodes can be formed surrounded by the ferrite substrate 1 in the peripheral region. Nevertheless, the part of the second connection conductor 9 in the side of the second external electrode 8 is formed not being surrounded by ferrite substrate material at the side face of the substrate 1. While the first and second external electrodes 7 and 8 are arranged in four sides in the peripheral region of the ferrite substrate 1, the external electrodes can be arranged in X-axis direction in the peripheral region (in two rows).

FIGS. 7 through 16 show a method that is a second embodiment of the present invention, for manufacturing a micro power converter, and are charts given in the sequence of the steps for manufacturing essential parts of the converter. First, a ferrite substrate 1 having an external configuration of 100 mm square and a thickness of 525 μm is prepared as shown in FIG. 7(a). To form through-holes for forming external electrodes and a coil in the ferrite substrate 1, patterning as shown in FIG. 7(b) is conducted on the front and back surfaces of the ferrite substrate 1 by means of photolithography using a photoresist not shown in the figure. The photoresist, which must have strength against sandblasting, employs a dry film with a thickness of 100 μm. Subsequently as shown in FIGS. 7(b) and 7(c), by means of sandblasting from the front surface of the ferrite substrate 1, first holes 32 and plural pairs of second holes 34 are dug. The first holes are surrounded by the ferrite substrate 1 and used for forming first connection conductors 6, and the second holes are dug in the outside region of the area 33 surrounding the first holes 32. The depth of these holes is not less than half the thickness of the ferrite substrate 1. Two second holes 34 composing the pair are arranged at either side of a scribe line 31 depicted by the dotted line in line symmetry with respect to the scribe line 31. Here, FIG. 7(a) is a plan view of the whole ferrite substrate 1; FIG. (b) is an enlarged plan view of the region "B" in FIG. 7(a) and shows the area where the region surrounded by the dotted line of scribe line 31 becomes a coil substrate 100; and FIG. 7(c) is a sectional view of an essential part taken along the line X-X in FIG. 7(b).

Figure 8A:
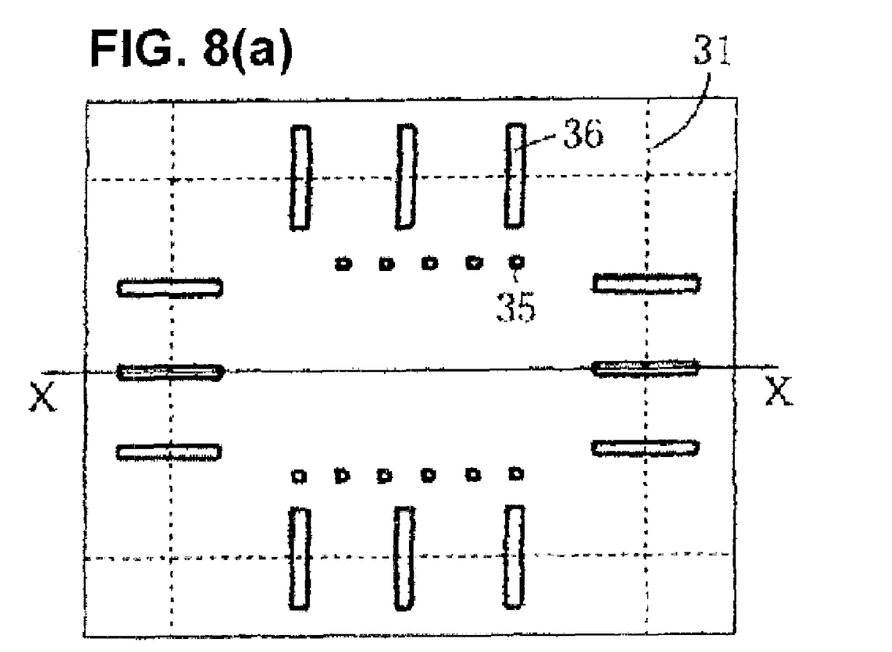
Figure 8B:
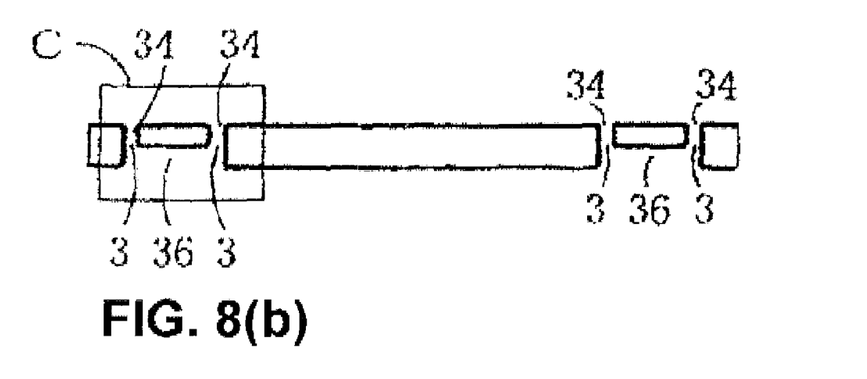

As shown in FIG. 8, third holes 35 surrounded by the ferrite substrate 1 and fourth holes 36 (oblong holes) with a oblong slit shape are dug from the back surface of the ferrite substrate 1 by means of sandblasting. The place of the fourth hole overlaps the place of a pair of the second holes 34. The depth of these holes is set such that these holes reaches the bottom of the first and second holes 32 and 34 to form first and second through-holes 2 and 3. (First through-holes are not shown in FIG. 8.) If the depth of the fourth holes 36 is excessively deep, the cut surface tends to break in the process of cutting the ferrite substrate 1 along the scribe line 31. Accordingly, the thickness of the ferrite substrate 1 not to expose the second through-hole 3 (that is the dimension equal to the thickness of original ferrite substrate subtracted by the depth dug for forming the fourth hole 36 by means of sandblasting) is preferably set to be at least 200 μm. Here, FIG. 8(a) is a plan view obtained by turning FIG. 7(b) over through rotation along the line X-X in the FIG. 7(b); and FIG. 8(b) is a sectional view taken along the line X-X in FIG. 8(a) and laying out the front surface at the top and the back surface at the bottom.

Figure 9:
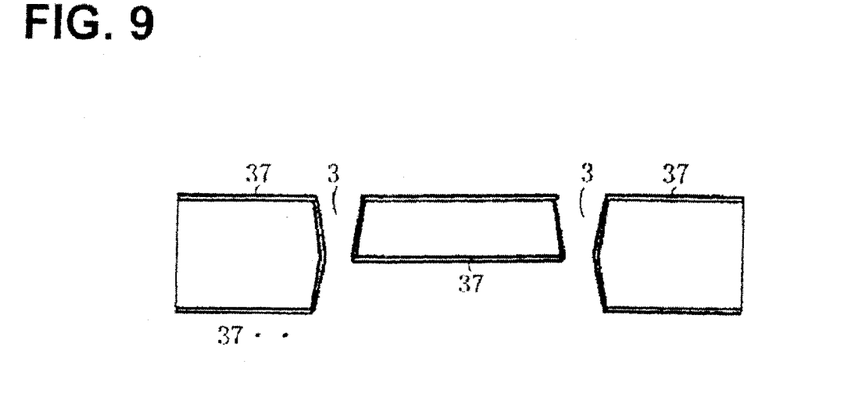
FIG. 9 shows an essential step following the step of FIG. 8, of a manufacturing process that is a second embodiment of the invention, for manufacturing a micro power converter.

As shown in FIG. 9, after peeling off the photoresist not shown in the figure and cleaning, a plating seed layer 37 consisting of titanium film 0.1 μm thick and copper film 1 μm thick on the titanium film is formed on the front and back surfaces of the ferrite substrate 1, and on side faces of first and second through-holes 2 and 3 by means of evaporation or sputtering. Alternatively, the plating seed 37 can be formed of a copper film 1 μm thick by means of electroless copper plating. Here, FIG. 9 is an enlarged view of the part "C" in FIG. 8(b).

Figure 10:
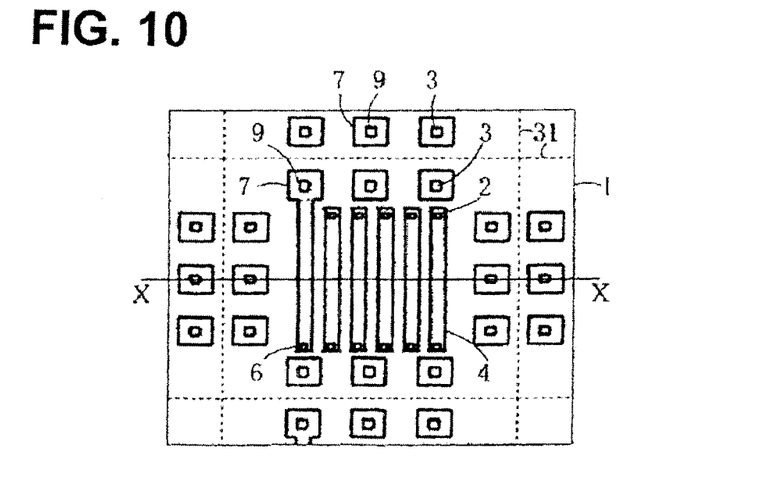
FIG. 10 is a plan view of the front surface side of the coil substrate showing an essential step following the step of FIG. 9, of a manufacturing process that is a second embodiment of the invention, for manufacturing a micro power converter.
Figure 11:
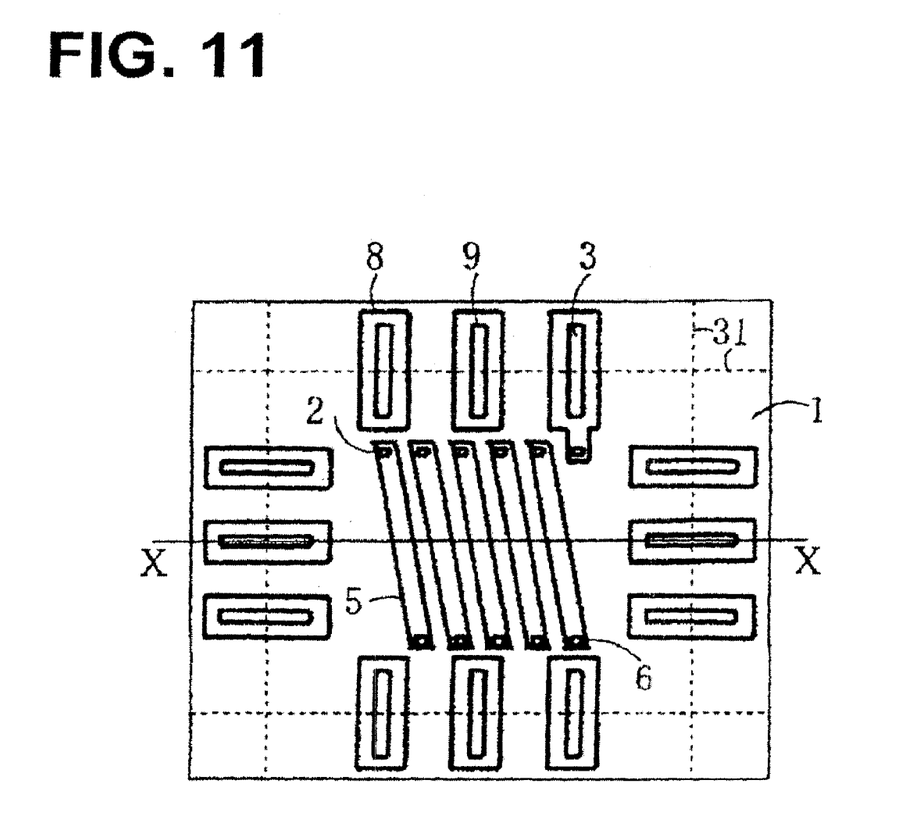
FIG. 11 is a plan view of the back surface side of the coil substrate showing an essential step following the step of FIG. 9, of a manufacturing process that is a second embodiment of the invention, for manufacturing a micro power converter.
Figure 12:
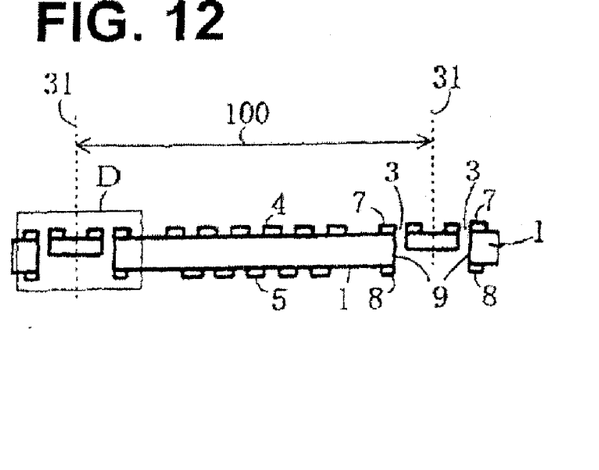
FIG. 12 is a sectional view of an essential part taken along the line X-X in FIG. 10 and FIG. 11.
Figure 13:
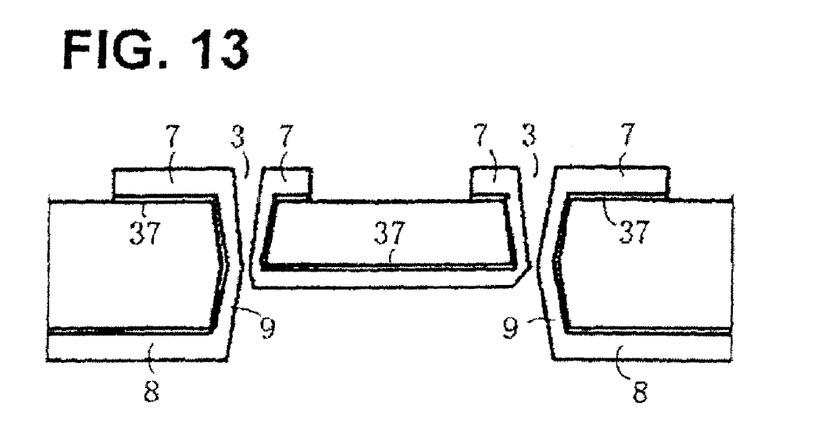
FIG. 13 is an enlarged drawing of the part "D" in FIG. 12.

As shown in FIGS. 10 through 13, patterning is conducted by means of photolithography using a dry film not shown in the figures for forming first and second coil conductors 4, 5, first and second external electrodes 7, 8, and first and second connection conductors 6, 9. Patterning for forming the first and second external electrodes 7, 8 that connect to second connection conductor 9 are carried out by creating openings on the dry film around the second holes on the front surface and around the fourth holes 36 on the back surface. After that, a copper film with a thickness in the range of 35 to 65 μm is formed on the plating seed layer 37 by means of electroplating. In order to prevent the thick cupper film from corrosion, anti-corrosion films of nickel film (2 μm) and gold film (1 μm) are formed on the thick copper film by means of plating. Thus, first and second coil conductors 4, 5, first and second external electrodes 7, 8, and first and second connection conductors 6, 9 are formed of a lamination of plating seed layer 37, a thick copper film, and a anti-corrosion film. Subsequently, after peeling the dry film off, excessive portion of the plating seed layer 37 is etched with a liquid agent using masks of first and second coil conductors 4, 5 and first and second external electrodes 7, 8. Thus, a plurality of coil substrates 100 is formed on the ferrite substrate 1. Here, FIG. 10 is a plan view of the front surface side of the ferrite substrate 1; FIG. 11 is a plan view of the back surface side of the ferrite substrate 1; and FIG. 12 is a sectional view taken along the line X-X in FIGS. 10 and 11. In these figures, the top is front side and the bottom is back side. FIG. 13 is an enlarged view of the part "D" in FIG. 12.

Figure 14:
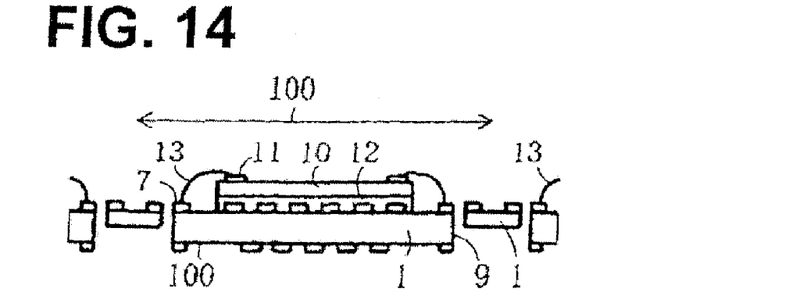
FIG. 14 shows an essential step following the steps of FIGS. 10 through FIG. 13, of a manufacturing process that is a second embodiment of the invention, for manufacturing a micro power converter.

As shown in FIG. 14, a power supply IC chip 10 is bonded on every coil substrate 100 with an adhesive 12, and the first external electrodes 7 and pad electrodes 11 are connected by bonding wires 13. The adhesive 12 is an insulative adhesive material. The insulative adhesive material can be a double layer consisting of an insulative protective film and a bonding material (regardless of conductive or insulative), the protective film coating the surface of the power supply IC chip 10 to be bonded to the coil substrate 100, and the bonding material covering the protective film and used for bonding with the coil substrate 100. Alternatively, as shown in FIG. 6, the external electrode 7 can be bonded to the stud bump 25 formed on the pad electrode of the power supply IC chip 10a.

Figure 15:
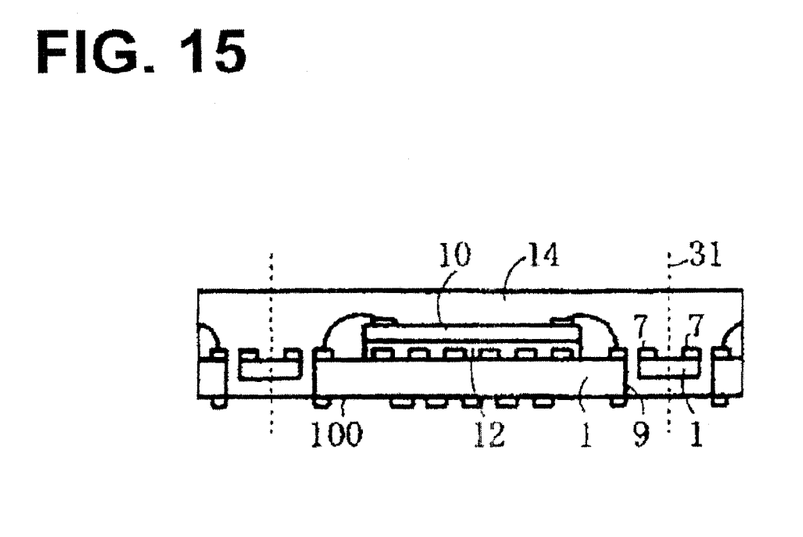
FIG. 15 shows an essential step following the step of FIG. 14, of a manufacturing process that is a second embodiment of the invention, for manufacturing a micro power converter.
Figure 16:
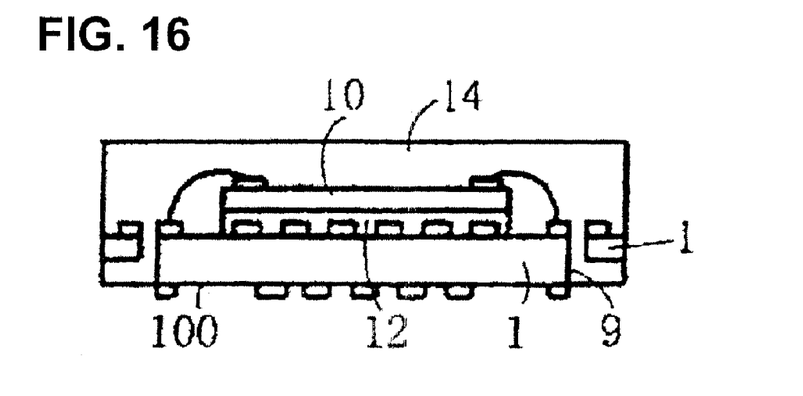
FIG. 16 shows an essential step following the step of FIG. 15, of a manufacturing process that is a second embodiment of the invention, for manufacturing a micro power converter.

As shown in FIG. 15, sealing is carried out with molding resin 14. Finally, the molding resin 14 and the ferrite substrate 1 are cut along the scribe line 31 (cutting line) indicated by the dotted line in FIG. 15. The scribe line locates in the region without the first external electrode 7 and at the midway between the second holes 34 composing a pair. Thus, a coil substrate 100 mounting a power supply IC chip 10 as shown in FIG. 16 (similar to FIG. 1 and FIG. 2) is formed, in which peripheral region is ferrite substrate 1 in the front side of the ferrite substrate 1 and the second connection conductors 9 are exposed to the atmosphere at the side face of the ferrite substrate 1 in the back side of the ferrite substrate 1. Additionally attaching a capacitor and other parts (not shown in the figure) on the coil substrate 100 mounting the power supply IC chip 10, a micro power converter is formed.

In the manufacturing method described above, the ferrite substrate 1 can be a disk. The through-holes can be formed by means of laser machining. This means does not need photolithography, which is essential for the dry film described previously, and thus the means simplifies the manufacturing process.

What is claimed is:

1. A micro power converter comprising:
    a coil substrate including a coil and external electrodes, a power supply IC chip bonded on a front surface side of the coil substrate, and a resin covering the front surface side of the coil substrate and a front surface side of the power supply IC chip;
    wherein the coil substrate is formed from a magnetic insulator substrate, with coil conductors formed in inner regions on front and back surfaces of the magnetic insulator substrate, and the external electrodes are formed in peripheral regions on the front and back surfaces of the magnetic insulator substrate;
    wherein the coil conductors formed in the inner regions on the front and back surfaces of the magnetic insulator substrate are connected by first connection conductors to form the coil and the external electrodes formed on the front and back surfaces of the magnetic insulator substrate are connected by second connection conductors; and
    wherein the second connection conductors are surrounded by the magnetic insulator substrate in the front surface side of the magnetic insulator substrate and a side face of the second connection conductor is not surrounded by the magnetic insulator substrate in the back surface side of the magnetic insulator substrate.

2. The micro power converter according to claim 1, wherein the magnetic insulator substrate is a ferrite substrate.

3. The micro power converter according to claim 1, wherein the front surface side of the coil substrate and a back surface side of the power supply IC chip are bonded with an insulator adhesive, and pad electrodes formed on a front surface of the power supply IC chip and the external electrodes formed on the front surface side of the coil substrate are electrically connected by bonding wires.

4. The micro power converter according to claim 1, wherein the external electrodes formed on the front surface side of the coil substrate and pad electrodes formed on a back surface side of the power supply IC chip are bonded by stud bumps.

5. A method of manufacturing a micro power converter that includes a magnetic insulator substrate, a power supply IC chip bonded on a front surface side of the magnetic insulator substrate, and a resin covering the front surface side of the magnetic insulator substrate and a front surface side of the power supply IC chip, the method comprising:
    (i) (a) forming a plurality of first holes from the front surface side towards an interior of the magnetic insulator substrate, and (b) forming plural pairs of second holes surrounding the first holes and on both sides of a straight line that becomes a scribe line, the pair of second holes consisting of two second holes disposed at line symmetric positions with respect to the straight line;
    (ii) (a) forming third holes each connecting to each of the first holes from the back surface side of the magnetic insulator substrate at positions of the first holes towards the interior of the magnetic insulator substrate, and (b) forming fourth holes each within an oblong shape each connecting to each of the pairs of the second holes at a place including the positions of the pair of the second holes surrounding the third holes from the back surface side towards the interior of the magnetic insulator substrate;
    (iii) (a) forming coil conductors on front and back surfaces of the magnetic insulator substrate connecting different first holes and different second holes, (b) the forming first connection conductors on side walls of the first holes and third holes connecting the coil conductors formed on the front and back surfaces, (c) forming plural pairs of front side external electrodes on the front surface side of the magnetic insulator substrate, each pair disposed at a place including the second holes, surrounded by the magnetic insulator substrate, off the scribe line and along the scribe line, and positioned line symmetric with respect to the scribe line, (d) forming back side external electrodes on the back surface side of the magnetic insulator substrate at places including at least a part of the positions projecting the pairs of second holes, and (e) forming second connection conductors on side walls of the second holes and the fourth holes, each second connection conductor connecting the front side external conductor and the back side external conductor;
    (iv) connecting the power supply IC chip to the front surface side of the magnetic insulator substrate;
    (v) covering the front surface side of the magnetic insulator substrate and front surface side of the power supply IC chip with the resin; and
    (vi) cutting the magnetic insulator substrate and the resin along the scribe line positioned between two external electrodes composing a pair on the front side of the magnetic insulator substrate.

6. The method according to claim 5, wherein the external electrode is manufactured by forming a seed layer that is formed of a titanium film and a copper film on the titanium film, or of a copper film alone, and then forming a copper film thicker than the copper film of the seed layer, on the seed layer.

* * * * *